(12) United States Patent
Chou et al.

(10) Patent No.: US 8,243,437 B2
(45) Date of Patent: Aug. 14, 2012

(54) ELECTRONIC DEVICE WITH EXPANSION CARD

(75) Inventors: Yi-Lung Chou, Taipei Hsien (TW); Li-Ping Chen, Taipei Hsien (TW); Wen-Hu Lu, Shenzhen (CN); Ya-Ni Zhang, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 319 days.

(21) Appl. No.: 12/723,090

(22) Filed: Mar. 12, 2010

(65) Prior Publication Data
US 2011/0096489 A1    Apr. 28, 2011

(30) Foreign Application Priority Data
Oct. 22, 2009 (CN) .................. 2009 2 0313039 U

(51) Int. Cl.
*H05K 5/00* (2006.01)
*H05K 7/00* (2006.01)

(52) U.S. Cl. ......... 361/679.49; 361/679.31; 361/679.32; 361/679.5; 361/679.51

(58) Field of Classification Search ............. 361/679.31, 361/679.32, 679.49, 679.5, 679.51
See application file for complete search history.

(56) References Cited

U.S. PATENT DOCUMENTS

| 6,349,042 | B1 * | 2/2002 | Mills et al. ................... 361/818 |
| 6,927,984 | B2 * | 8/2005 | Chen ............................ 361/801 |
| 7,881,062 | B2 * | 2/2011 | Chen et al. .................... 361/725 |
| 7,929,288 | B1 * | 4/2011 | Ma et al. .................. 361/679.32 |

* cited by examiner

*Primary Examiner* — Anthony Haughton
(74) *Attorney, Agent, or Firm* — Altis Law Group, Inc.

(57) ABSTRACT

An electronic device includes a chassis having a bottom wall. A motherboard is disposed on the bottom wall. A riser card is perpendicularly connected to the motherboard. An airflow duct is located on the bottom wall of the chassis. A securing member is mounted to the airflow duct. The securing member includes a supporting piece secured to the airflow duct, and a securing piece is pivotally mounted to the supporting piece. The securing piece is engaged with the supporting piece to clamp an expansion card between the supporting piece and the securing piece.

18 Claims, 6 Drawing Sheets

ELECTRONIC DEVICE WITH EXPANSION CARD

BACKGROUND

1. Technical Field

The present disclosure relates to electronic devices, particularly, to an electronic device with an expansion card.

2. Description of Related Art

A computer system usually includes expansion cards, such as sound cards, video cards, graphics cards and so on, for enhancing capabilities of the computer system. Conventionally, an expansion card is coupled to a riser card, and one end of the expansion card is secured to a rear wall of the computer system enclosure. However, some expansion cards have long sizes. If the long expansion cards are secured to the computer enclosure in the conventional manner, they will not be stable.

BRIEF DESCRIPTION OF THE DRAWINGS

Many aspects of the embodiments can be better understood with references to the following drawings. The components in the drawings are not necessarily drawn to scale, the emphasis instead being placed upon clearly illustrating the principles of the embodiments. Moreover, in the drawings, like reference numerals designate corresponding parts throughout the several views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
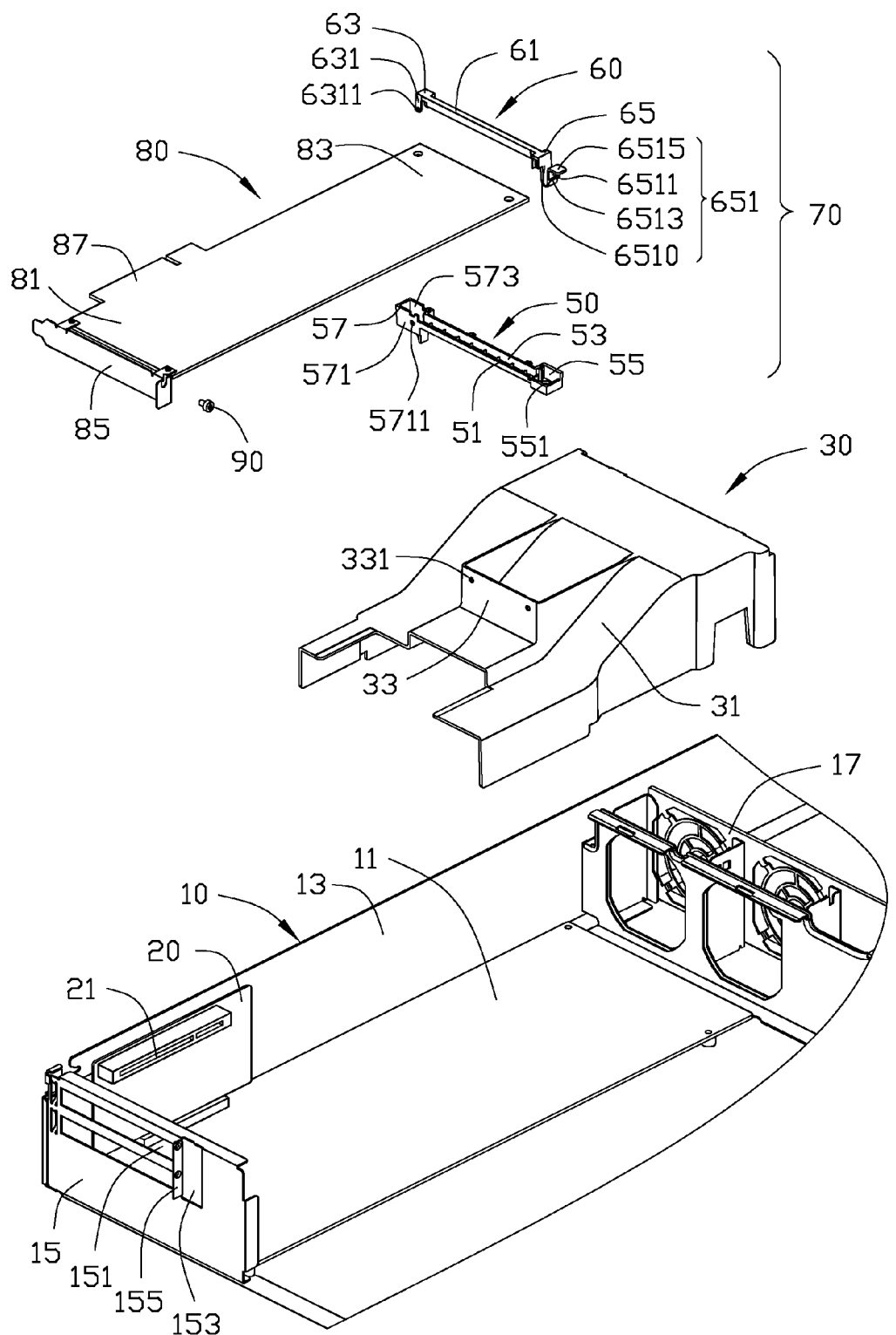
FIG. 1 is an exploded, isometric view of an electronic device in accordance with an embodiment.
Figure 2:
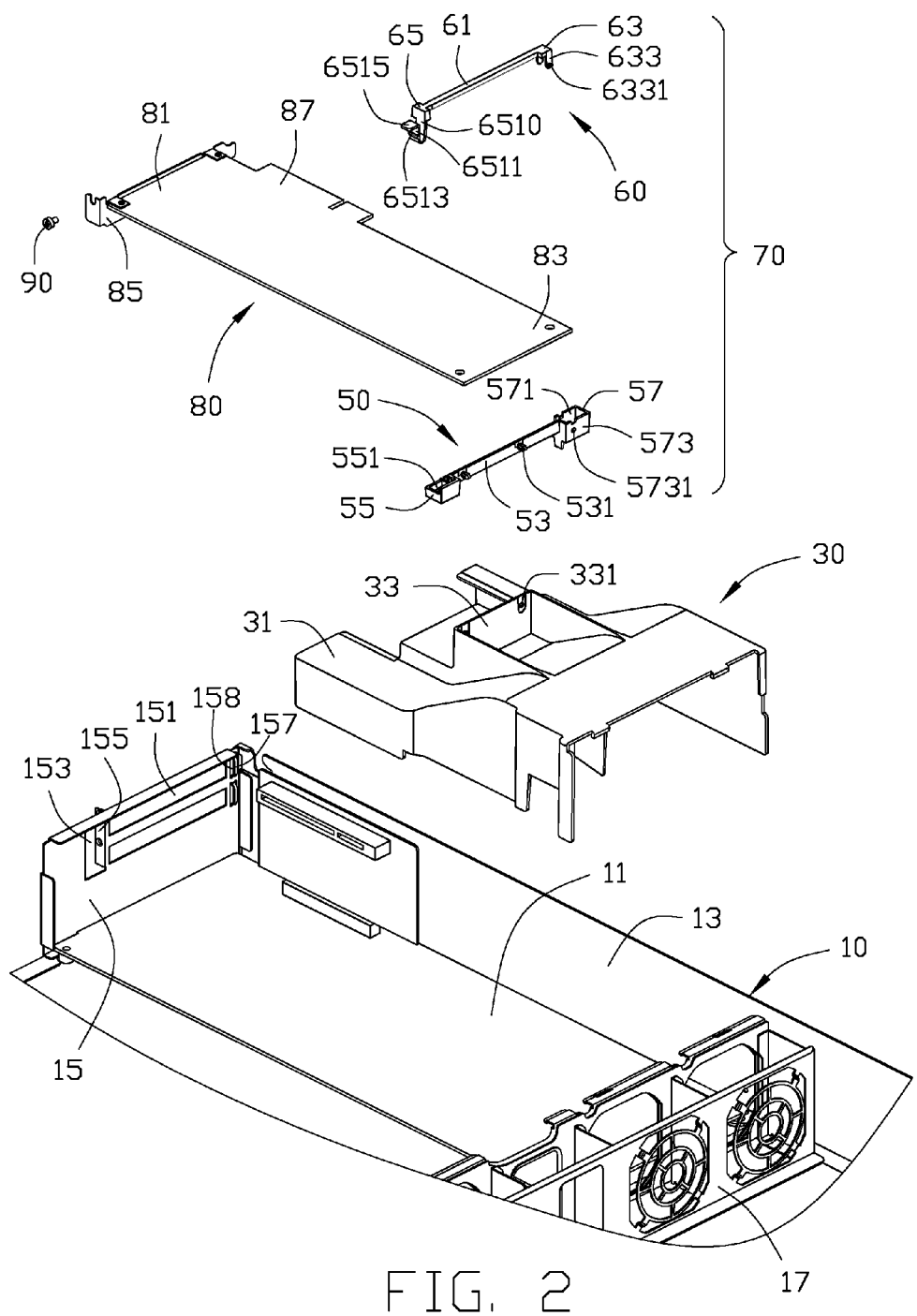
FIG. 2 is similar to FIG. 1, but viewed in another aspect.

Referring to FIGS. 1 and 2, an electronic device in accordance with one embodiment includes a chassis 10, an airflow duct 30 disposed in the chassis 10, an expansion card 80, and a securing member 70 configured to mount the expansion card 80 in the chassis 10. The expansion card 80 includes a first end 81, a second end 83 opposite to the first end 81, a fixing piece 85 secured to the first end 81, and a connecting portion 87.

The chassis 10 includes a bottom wall 11, a sidewall 13, and a rear wall 15. A motherboard 113 is located in the bottom wall 11. A riser card 20 adjacent to the sidewall 13 is perpendicularly connected to the motherboard 113. A socket 21 is disposed at one side of the riser card 20. The rear wall 15 defines a plurality of expansion card slots 151. An opening 153 is defined adjacent to the expansion card slots 151. A mounting piece 155, extends from one side edge of the opening 153, and is configured to secure the fixing piece 83 of the expansion card 80. A bridge 157 is located on an inner side of the chassis rear wall 15, at one side adjacent to the expansion card slots 151 and opposite to the opening 153. The bridge 157 defines a slot 158 configured for the fixing piece 83 to be inserted therein. A fan mounting bracket 17 is secured in the chassis bottom wall 11 and opposite to the chassis rear wall 15. A plurality of fans (not shown) is accommodated in the fan mounting bracket 17, to blow air towards the chassis rear wall 15, for cooling the electronic components, such as a CPU on the motherboard 113.

The airflow duct 30 includes a top wall 31. A mounting wall 33, parallel to the chassis rear wall 15, extends up from the top wall 31. Two securing holes 331 are defined in the mounting wall 33. The airflow duct 30 is configured to guide airflow towards the electronic components on the motherboard 113.

Figure 3:
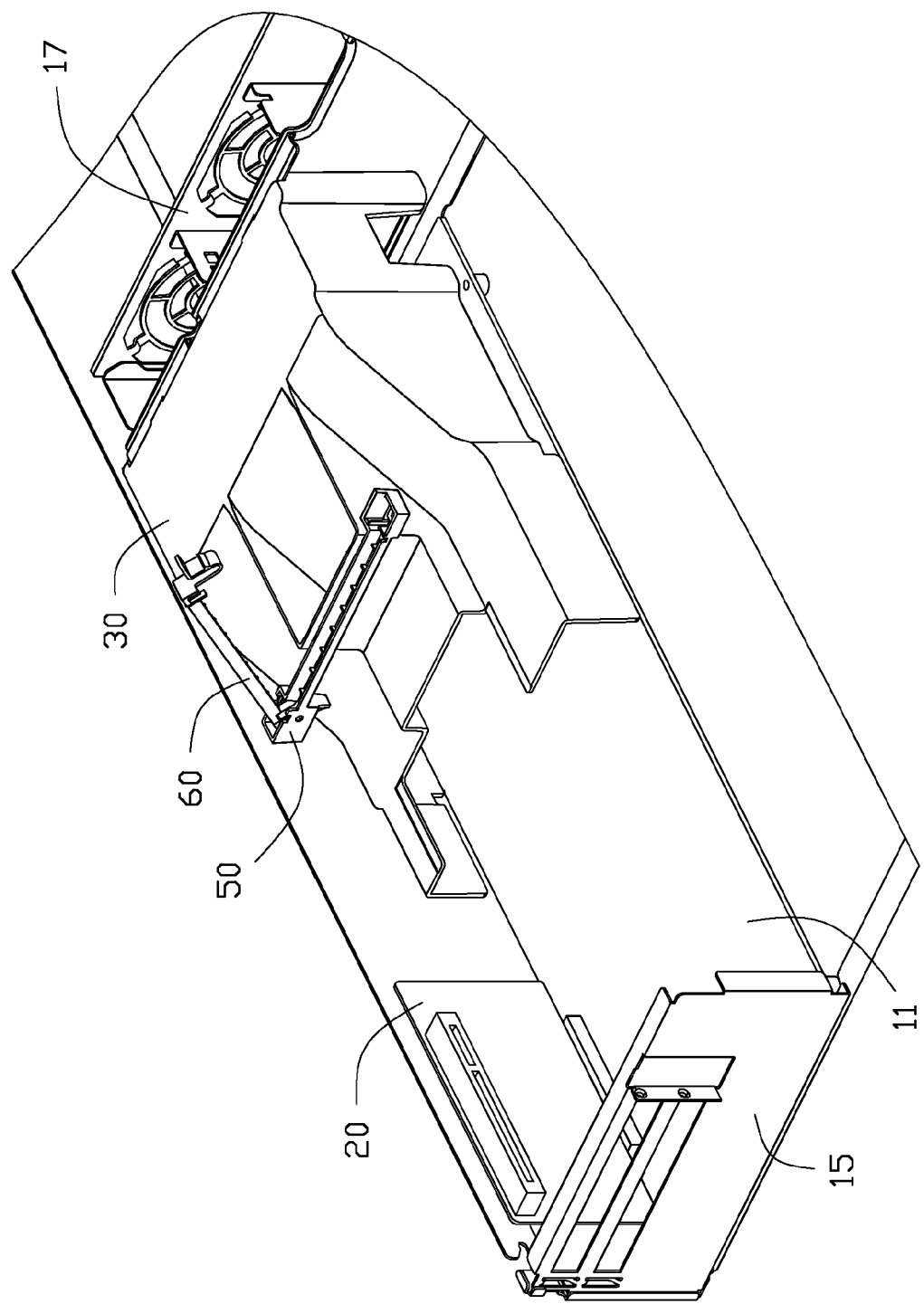
FIG. 3 is an assembled view of the electronic device of FIG. 1, with an expansion card removed.

Referring to FIG. 3, the securing member 70 includes a supporting piece 50 and a securing piece 60, that is pivotably mounted to the supporting piece 50.

The supporting piece 50 includes a supporting bar 51 and a securing wall 53 parallel to the supporting bar 51. Two securing posts 531 protrude from an outside of the securing wall 53. A securing portion 55 extends one end of the supporting bar 51. The securing portion 55 defines a securing slot 551. A mounting portion 57 extends from the other end of the supporting bar 51. The mounting portion 57 includes a first sidewall 571 and a second sidewall 573. The first sidewall 571 defines a first pivot hole 5711, and the second sidewall 573 defines a second pivot hole 5731.

The securing member 60 includes a pressing bar 61, a pivot end 63, and a securing end 65. The pivot end 63 includes two pivot tabs 631 and 633. Two pivot posts 6311 and 6331, respectively protrude from the pivot tabs 631 and 633, and correspond to the first pivot hole 5711 and second pivot hole 5731. An elastic hook 651 protrudes from the securing end 65 and is configured to engage in the securing slot 551 of the supporting member 50. The elastic hook 651 includes a base wall 6510 extending down from the securing end 65, and a movable wall 6511 connected to the base wall 6510. In one embodiment, the elastic hook 651 is U-shaped. A blocking portion 6513 protrudes from an outside of the movable wall 6511. In one embodiment, the elastic hook 651 is wedge shaped. An operating handle 6515 extends from a top end of the movable wall 6511.

Referring to FIG. 3, in assembly, the airflow duct 30 abuts the fan mounting bracket 17 and is secured in the chassis 10. The airflow duct 30 guides air from the fans towards the rear wall 15 of the chassis 10. The securing posts 531 of the supporting piece 50 engage in the securing holes 331 in the mounting wall 33 of the airflow duct 30. The pivot posts 6311 and 6331 of the securing piece 60 engage in the first pivot hole 5711 and the second pivot hole 5731, thereby pivotably mounting the securing piece 60 to the supporting piece 50. Thus, the securing member 70 is secured to the mounting wall 33 of the airflow duct 30.

Figure 4:
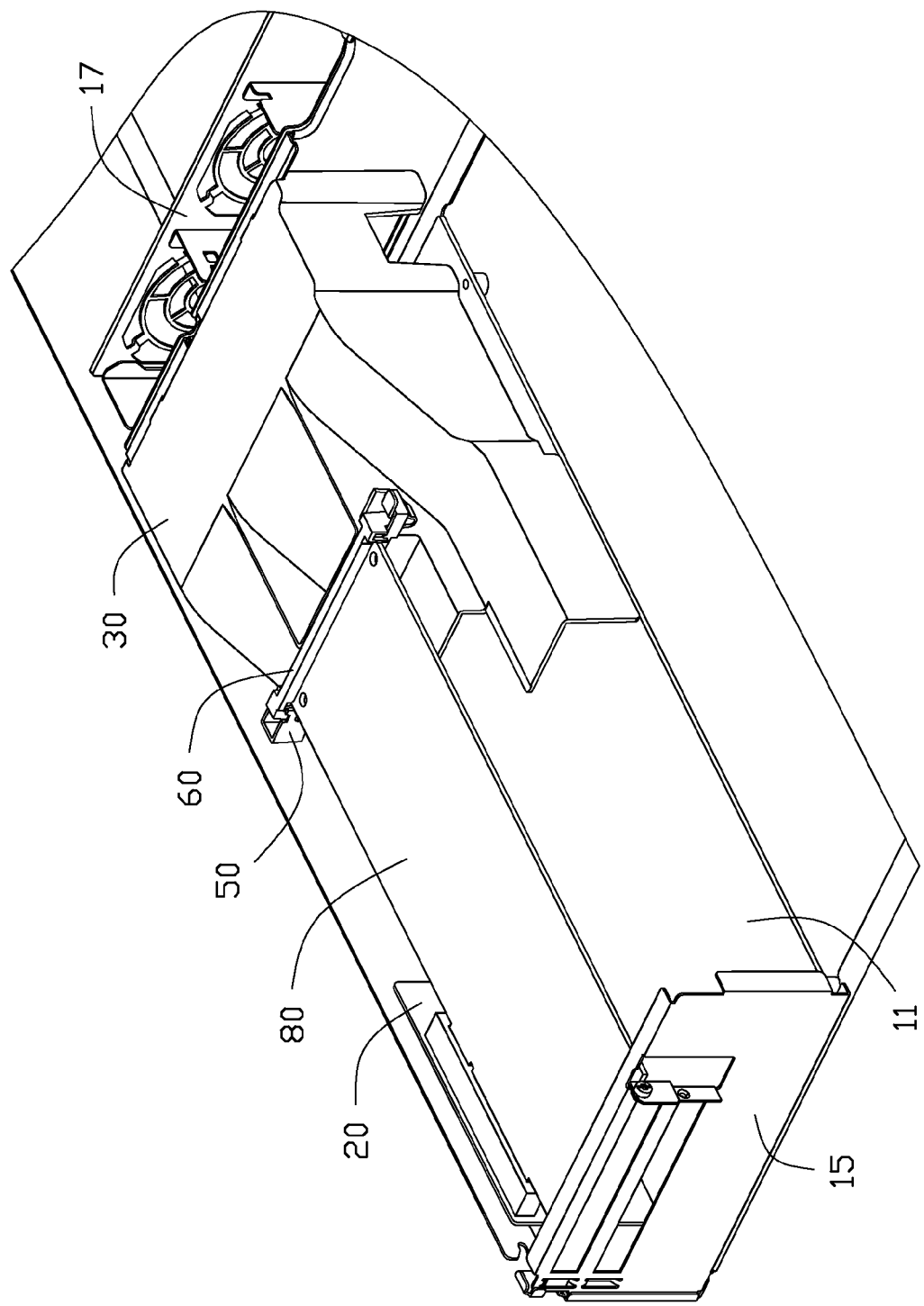
FIG. 4 is an assembled view of FIG. 1.
Figure 5:
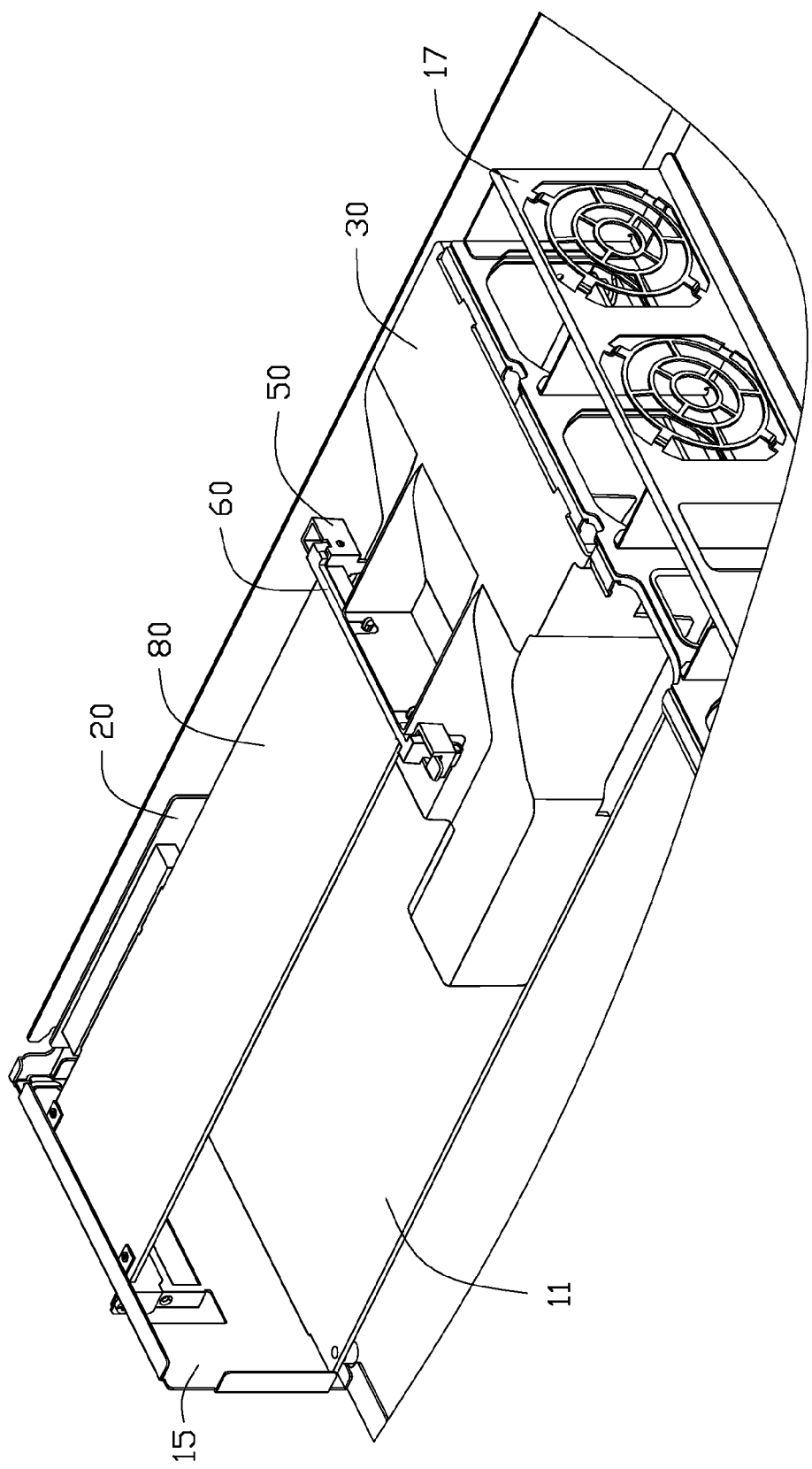
FIG. 5 is similar to FIG. 4, but viewed in another aspect.

Referring also to FIGS. 4 and 5, in assembly, the fixing piece 81 of the expansion card 80 is inserted in the slot 158 of the bridge 157. The connecting portion 87 of the expansion card 80 is inserted in the socket 21 of the riser card 20. The first end 81 of the expansion card 80 is coupled to one expansion card slot 151 in the chassis rear wall 15 and secured to the chassis rear wall 15 with a fastener 90. The second end 83 of the expansion card 80 is located on the supporting bar 53 of the supporting piece 50. Then, the securing piece 60 is rotated about a pivot axis defined by the pivot end 63, which is perpendicular to the chassis rear wall 15, and the elastic hook 651 is inserted in the securing slot 551 of the supporting piece 50. The blocking portion 6513 abuts a side edge of the securing slot 551, thereby moving the movable wall 6511 towards the base wall 6510. When the blocking portion 6513 is inserted through the securing slot 551, the movable wall 6511 rebounds back and is blocked underneath the securing portion 55. Thus, the second end 65 of the expansion card 80 is clamped between the supporting bar 51 of the supporting piece 50 and the pressing bar 61 of the securing piece 60. The expansion card 80 is secured in the chassis 10 parallel to the motherboard 113.

Figure 6:
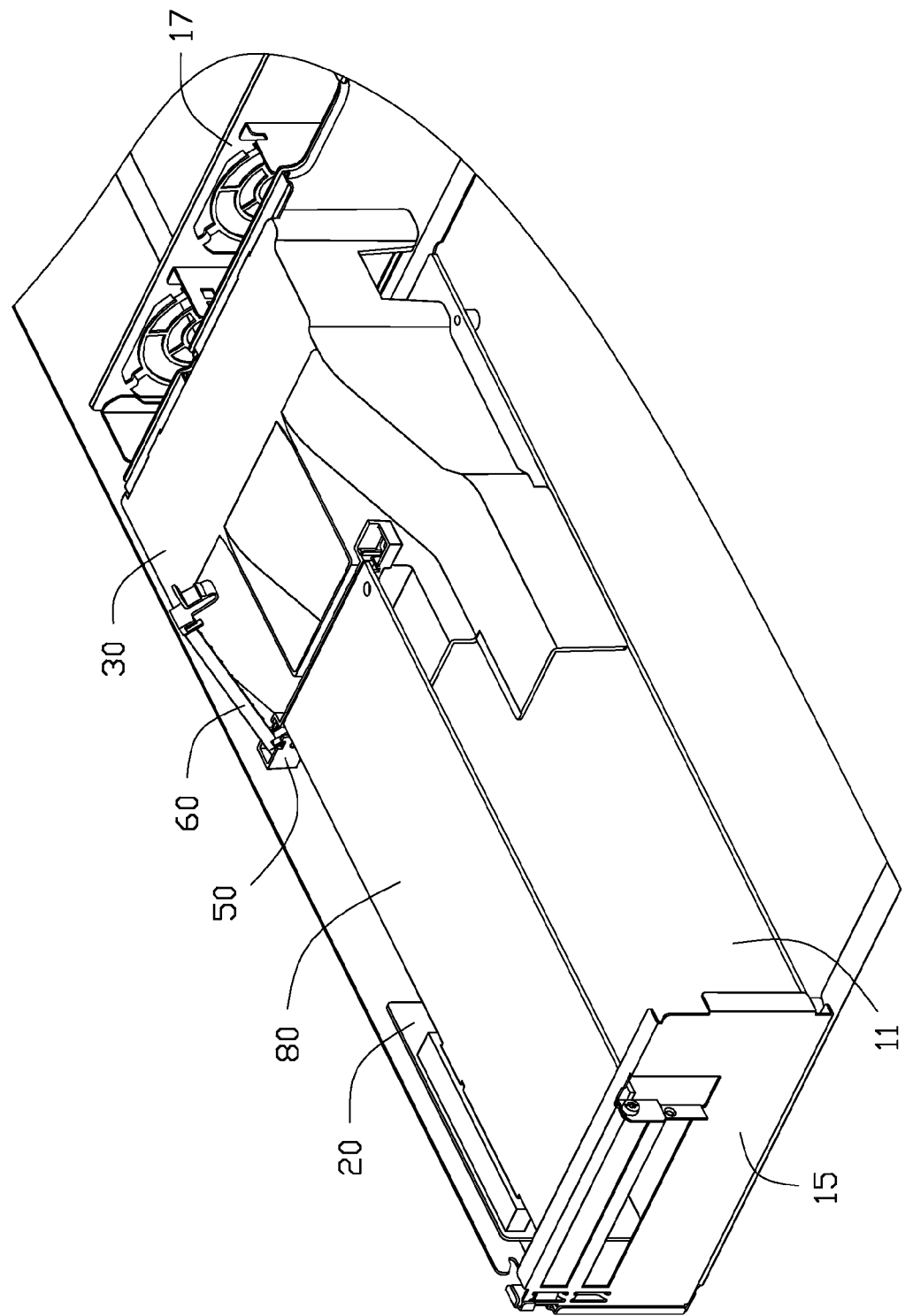
FIG. 6 is similar to FIG. 5, with the expansion card disassembled.

Referring to FIG. 6, in disassembly, the operating portion 6515 is pushed towards the base wall 6510 of the elastic hook 651. The blocking portion 6515 of the elastic hook 651 is disengaged from the securing slot 551 in the securing portion 55 of the supporting piece 50. The securing piece 60 is pivoted away from the expansion card 80. Thus, the second end 83 of the expansion card 80 is released. When the fastener 90 at the first end 81 of the expansion card 80 is loosened, the expansion card 80 may be removed from the chassis 10.

It is to be understood, however, that even though numerous characteristics and advantages of the embodiments have been set forth in the foregoing description, together with details of the structure and function of the present disclosure, the disclosure is illustrative only, and changes may be made in detail, especially in matters of shape, size, and arrangement of parts within the principles of the embodiments to the full extent indicated by the broad general meaning of the terms in which the appended claims are expressed.

What is claimed is:

1. An electronic device, comprising:
   a chassis having a bottom wall;
   a motherboard disposed on the bottom wall, and a riser card perpendicularly connected to the motherboard;
   an airflow duct located on the bottom wall of the chassis; and
   a securing member mounted to the airflow duct, the securing member comprising a supporting piece, secured to the airflow duct, and a securing piece, pivotally mounted to the supporting piece; and the securing piece engages with the supporting piece to clamp an expansion card between the supporting piece and the securing piece.

2. The electronic device of claim 1, wherein a fan mounting bracket is mounted on the bottom wall, and the airflow duct abuts the fan mounting bracket to guide air flow towards the rear wall of the chassis.

3. The electronic device of claim 1, wherein the supporting piece comprises a longitudinal supporting bar; the securing piece is pivotally mounted to the supporting bar, and comprises a pressing bar; and the expansion card is clamped between the supporting bar and the pressing bar.

4. The electronic device of claim 3, wherein a securing portion extends from the supporting bar, an elastic hook protrudes from an end of the pressing bar, and a securing slot is defined in the securing portion; the elastic hook engages in the securing slot.

5. The electronic device of claim 3, wherein the elastic hook comprises a movable wall received in the securing slot and resiliently abutting an inner side of the securing slot.

6. The electronic device of claim 5, wherein an operating handle is located on a free end of the movable wall of the elastic hook.

7. The electronic device of claim 3, wherein the airflow duct comprises a mounting wall parallel to the chassis rear wall, and the supporting piece is secured to the mounting wall.

8. The electronic device of claim 7, wherein the supporting piece comprises a securing wall parallel to the supporting bar, the securing wall abuts the mounting wall, and two securing posts protrude from the securing wall and engage in two securing holes defined by the mounting wall.

9. The electronic device of claim 1, wherein the securing piece is rotatable about a pivot axis that is perpendicular to the chassis rear wall.

10. An electronic device, comprising:
    a chassis having a bottom wall, and a sidewall;
    a motherboard disposed on the bottom wall, and a riser card perpendicularly connected to the motherboard;
    an airflow duct located on the bottom wall of the chassis; and
    a securing member mounted to the airflow duct, the securing member comprising a supporting piece, secured to the airflow duct, and a securing piece, having a pivot end away from the chassis sidewall and a securing end adjacent to the chassis sidewall; the pivot end is mounted to the supporting piece; the securing end is rotatable about the pivot end, engages the supporting piece, and is capable of clamping an expansion card between the supporting piece and the securing piece.

11. The electronic device of claim 10, wherein a fan mounting bracket is mounted on the bottom wall, and the airflow duct abuts the fan mounting bracket to guide air flow toward the rear wall of the chassis.

12. The electronic device of claim 10, wherein the supporting piece comprises a longitudinal supporting bar; the securing piece comprises a pressing bar; and the expansion card is clamped between the supporting bar and the pressing bar.

13. The electronic device of claim 12, wherein a securing portion extends from the other end of the supporting bar, an elastic hook protrudes from an end of the pressing bar, and a securing slot is defined in the securing portion; and the elastic hook engages in the securing slot.

14. The electronic device of claim 12, wherein the elastic hook comprises a movable wall; the movable wall is received in the securing slot and resiliently abuts an inner side of the securing slot.

15. The electronic device of claim 14, wherein an operating handle is located on a free end of the movable wall of the elastic hook.

16. The electronic device of claim 15, wherein the elastic hook is U-shaped.

17. The electronic device of claim 12, wherein the airflow duct comprises a mounting wall parallel to the chassis rear wall, and the supporting piece is secured to the mounting wall.

18. The electronic device of claim 17, wherein the supporting piece comprises a securing wall parallel to the supporting bar, the securing wall abuts the mounting wall, and two securing posts protrude from the securing wall and engage in two securing holes defined by the mounting wall.

\* \* \* \* \*